(12) United States Patent  
Kliewer et al.

(10) Patent No.: US 8,390,998 B2  
(45) Date of Patent: Mar. 5, 2013

(54) CONFIGURABLE FAN UNIT

(75) Inventors: Edward Kliewer, Sunnyvale, CA (US); Joseph Jacques, Austin, TX (US)

(73) Assignee: Cisco Technology, Inc., San Jose, CA (US)

( * ) Notice: Subject to any disclaimer, the term of this patent is extended or adjusted under 35 U.S.C. 154(b) by 280 days.

(21) Appl. No.: 12/958,387

(22) Filed: Dec. 1, 2010

(65) Prior Publication Data

US 2012/0140406 A1  Jun. 7, 2012

(51) Int. Cl.  
*H05K 7/20* (2006.01)

(52) U.S. Cl. ......... 361/679.48; 361/679.46; 361/679.49; 361/679.5; 361/679.51; 361/695

(58) Field of Classification Search .................. None  
See application file for complete search history.

(56) References Cited

U.S. PATENT DOCUMENTS

| | | | |
|---|---|---|---|
| 4,774,631 A | 9/1988 | Okuyama et al. ............. | 361/384 |
| 6,603,661 B2 * | 8/2003 | Smith et al. ................... | 361/695 |
| 6,722,971 B2 * | 4/2004 | Gough ........................... | 454/187 |
| 7,068,505 B2 * | 6/2006 | Kosugi ........................... | 361/690 |
| 7,272,002 B2 | 9/2007 | Drapeau ........................ | 361/687 |
| 7,920,384 B2 * | 4/2011 | Westphall et al. ............. | 361/727 |
| 7,983,039 B1 * | 7/2011 | Nguyen et al. ................ | 361/695 |
| 2003/0223196 A1 | 12/2003 | Smith et al. ................... | 361/687 |
| 2007/0019382 A1 | 1/2007 | Gundlach ..................... | 361/695 |
| 2007/0178822 A1 | 8/2007 | Lanus et al. ................... | 454/184 |

* cited by examiner

*Primary Examiner* — Boris Chervinsky  
(74) *Attorney, Agent, or Firm* — Brinks Hofer Gilson & Lione

(57) ABSTRACT

In order to increase the flexibility of the positioning of a stacked computer system within a data center, a removable fan unit is positioned within the computer system. The removable fan unit includes a fan housing that supports a fan electrically connected to a connector extending from a side of the fan housing. The connector of the removable fan unit may be electrically connected to a computer system-side connector in a first orientation to move air through the computer system in a first direction. The connector or another connector of the removable fan unit may be electrically connected to another or the same computer system-side connector in a second orientation to move air through the computer system in a second direction.

20 Claims, 5 Drawing Sheets

US 8,390,998 B2

CONFIGURABLE FAN UNIT

FIELD

The present embodiments relate to a configurable fan unit.

BACKGROUND

Data centers include rows of stacked computer and/or communication systems. For cooling purposes, the computer systems draw air from the surrounding environment into the systems at one side (e.g., the front) and exhaust the air out of the systems at another side (e.g., the back). A data center may include an arrangement of hot aisles and cold aisles in order to increase the cooling efficiency of the data center. By mounting a row of the stacked computer systems in the same direction, cold air from the cold aisle will flow into the systems, and hot air will exhaust out of the systems to the hot aisle.

For the hot and cold aisle arrangement, two versions of each type of computer system (e.g., two versions of a switch), one version that provides front-to-back airflow and another version that provides back-to-front airflow, may be produced. One or more fans may be fixed in version-specific orientations in each version of the stacked computer systems to provide the respective front-to-back or back-to-front airflow. The version of the computer system (e.g., front-to-back or back-to-front) installed in a data center may depend on the location of the computer system within the data center (e.g., hot aisle or cold aisle).

DETAILED DESCRIPTION OF THE DRAWINGS

Overview

Figure 1:
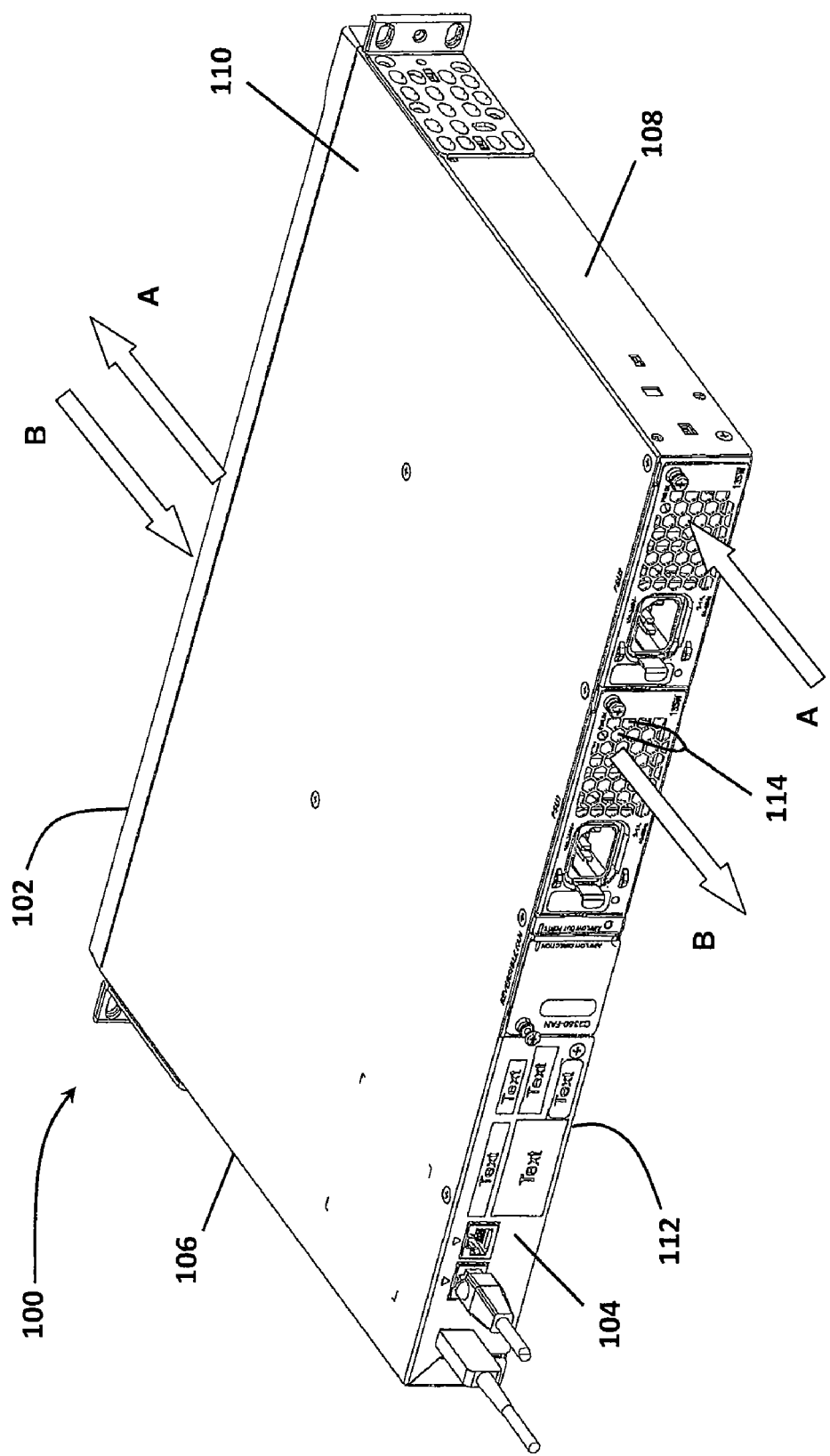
FIG. 1 illustrates a perspective view of one embodiment of a housing with a configurable fan unit.

A fan tray cooling module may be installed in one of two orientations. The two orientations provide either front-to rear or rear-to-front airflow through the system. The cooling module is configurable after installation and may be customer oriented or serviced.

In order to increase the flexibility of the positioning of a stacked computer system within a data center, a removable fan unit is positioned within the computer system. The removable fan unit includes a fan housing that supports a fan electrically connected to a connector extending from a side of the fan housing. The connector of the removable fan unit may be electrically connected to a computer system-side connector in a first orientation to move air through the computer system in a first direction. The connector or another connector of the removable fan unit may be electrically connected to another or the same computer system-side connector in a second orientation to move air through the computer system in a second direction.

In one embodiment, an apparatus includes a fan unit housing including a back, the fan unit housing being removably attachable to a computer system. The apparatus includes a fan supported by the fan unit housing, and an electrical connector on the back of the fan unit housing. The electrical connector is electrically connected to the fan. The fan unit housing is operable to be positioned in the computer system in two different orientations, such that the electrical connector is physically mated with a first computer system-side connector in at least one of the two different orientations. The fan is operable to be electrically connected to the computer system in each of the two different orientations, such that the fan moves air through the computer system in two corresponding directions.

In another embodiment, an apparatus includes a rack-mounted electrical hardware component including a heat generating component, and a fan unit removably attached to the rack-mounted electrical hardware component in a first orientation. The fan unit includes a fan housing including a back, two fans attached to the fan housing, and two electrical connectors extending from the back of the fan housing. The two electrical connectors are electrically connected to the two fans. The fan unit is operable to be removably inserted into the rack-mounted electrical hardware component, such that one of the two electrical connectors is physically mated with and electrically connected to a corresponding rack-mounted electrical hardware component-side connector. In the first orientation, the two fans move air through the apparatus in a first direction relative to the rack-mounted electrical hardware component to cool the heat generating component.

In yet another embodiment, a method includes electrically connecting a removable fan unit to an electrical hardware system, the connection configured to move air through the electrical hardware system in a first direction. The method also includes rotating the removable fan unit and electrically connecting the removable fan unit to the electrical hardware system to move air through the electrical hardware system in a second direction. Electrically connecting the removable fan unit includes physically mating an electrical connector on the removable fan unit with an electrical hardware system-side connector.

Example Embodiments

FIG. 1 illustrates a perspective view of one embodiment of a box-type housing 100 for stacking. The housing 100 includes a front 102, a back 104, a first side 106 and a second side 108. The housing 100 also includes a top 110 and a bottom 112. The box-type housing 100 may be any number of shapes including, for example, a rectangular box. Other non-box housings may be used.

The back 104 of the housing 100 includes a plurality of holes 114 (e.g., air intakes/outtakes). The plurality of holes 114 may be equally-sized and equally-spaced. Other patterns of holes or a single hole may be used. In one embodiment, the back 104 and the top 110 of the housing 100 form a slot that extends along the length of the back 104 of the housing 100. In another embodiment, the back 104 and the top 110 of the housing 100 form a plurality of slots spaced along at least a portion of the length of the back 104 of the housing 100.

Figure 2:
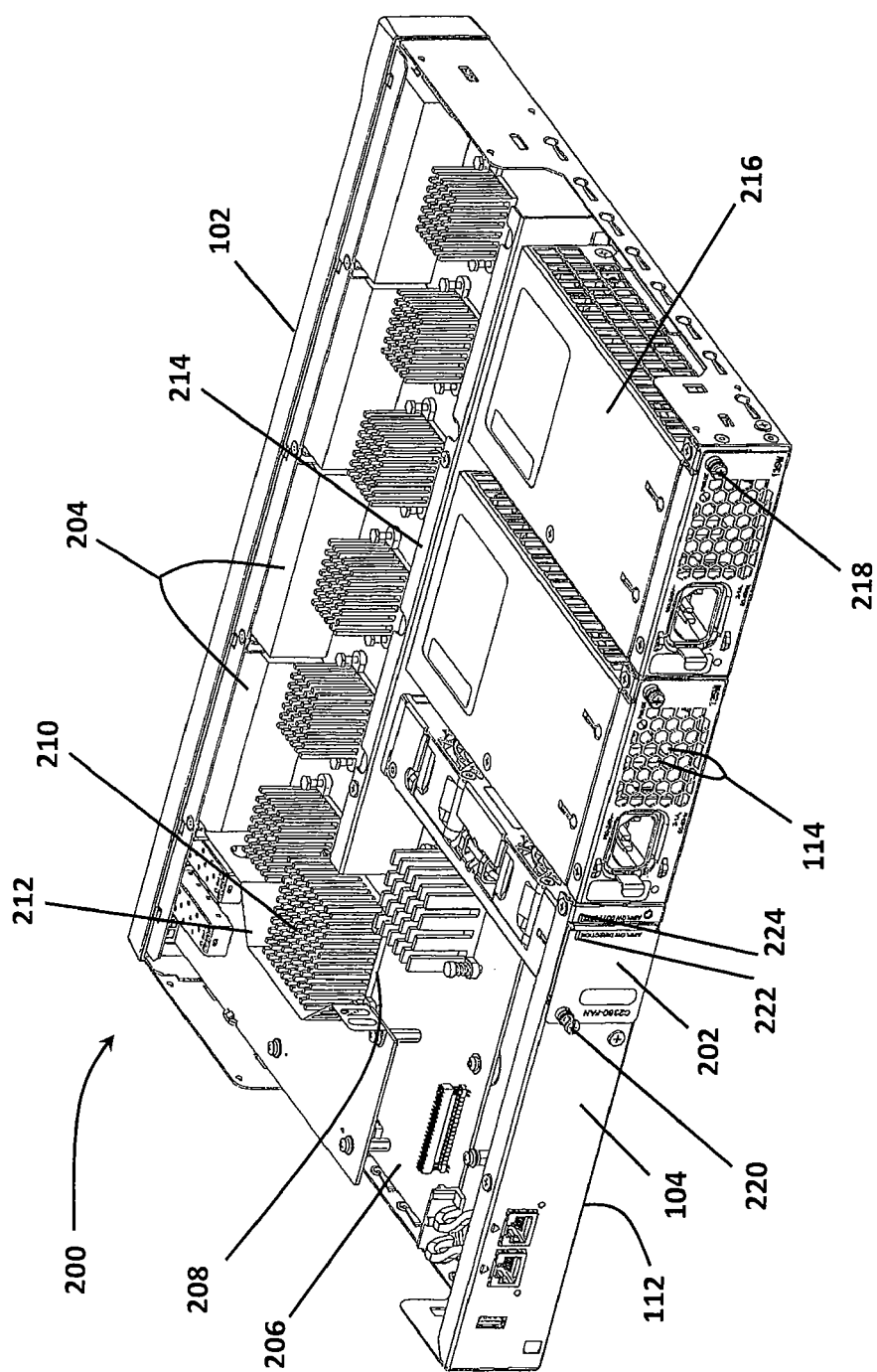
FIG. 2 illustrates a perspective view of one embodiment of an interior of the housing of FIG. 1.

The front 102 of the housing 100 and the top 110 of the housing 100 form a plurality of slots, holes, or both (e.g., air outtakes/intakes; shown in FIG. 2). The plurality of slots may be spaced along the length or a portion of the length of the front 102 of the housing 100. In one embodiment, a single slot runs the length of the front 102 of the housing 100. In another embodiment, the front 102 of the housing 100 includes a plurality of equally-sized holes. Additional openings (e.g., holes and/or slots) may be included in the front 102, the back 104, the first side 106, the second side 108, the top 110 and/or the bottom 112 of the housing 100. The openings may be near but not on the back and/or front.

In one embodiment, air is pulled into the housing 100 at the plurality of holes 114 in the back 104 of the housing 100 and pushed out of the housing 100 at the plurality of slots in the front 102 of the housing 100, as shown by arrow A. In another embodiment, air is pulled into the housing 100 at the plurality of slots in the front 102 of the housing and pushed out of the housing 100 at the plurality of holes 114 in the back 104 of the housing 100, as shown by arrow B.

FIG. 2 illustrates a perspective view of one embodiment of a switch 200 including the housing 100 of FIG. 1 or a different housing and one embodiment of a configurable fan unit 202. Similar arrangements may be provided for other devices than a switch. FIG. 2 illustrates the switch 200 with the top 110 of the housing 100 (as shown in FIG. 1) removed. The switch 200 includes a plurality of components 204 such as, for example, a plurality of input/output (I/O) connectors (e.g., RJ45 connectors or SFP connectors) at the front 102 of the housing 100. I/O is used for only input, only output, or both input and output connections.

The bottom 112 of the housing 100 may support a printed circuit board (PCB) 206 or a substrate (e.g., the PCB 206), and a plurality of heat generating electrical hardware components 208 may be supported by and electrically connected (e.g., soldered) to the PCB 206. The plurality of heat generating electrical hardware components 208 may include, for example, processors, circuits, transistors, memory devices, power supplies, or other electronics.

Heat sinks 210 may be attached to some or all of the plurality of heat generating electrical hardware components 208. The heat sinks 210 may be attached to the heat generating electrical hardware components 208 using, for example, a thermal interface material, a thermal adhesive, nut/bolt combinations, other devices, or a combination thereof. The heat sinks 210 may aid in the transfer of heat from the plurality of heat generating electrical hardware components 208 to the surrounding air.

The bottom 112 of the housing 100, the PCB 206 or another part of the switch 200 may support one or more baffles 212 and a separation wall 214. The one or more baffles 212 may be supported using, for example, an adhesive, nut/bolt combinations, tabs and corresponding recesses, other devices, or a combination thereof. The one or more baffles 212 may direct air pulled in or pushed out of the plurality of holes 114 in the back 104 of the housing 100 around the heat sinks 210 attached to some or all of the heat generating electrical hardware components 208. In one embodiment, the one or more baffles 212 may also separate air flow between some components 204 (e.g., optical connectors) of the plurality and one or more heat sinks 210. In either flow direction, the one or more baffles 212 may prevent the one or more heat sinks 210 from adding heat to the components 204 and may prevent the components 204 from adding heat to the one or more heat sinks 210.

The separation wall 214 may be supported using, for example, an adhesive, nut/bolt combinations, other devices, or a combination thereof. The separation wall 214 may extend part of the length of the switch 200, between the configurable fan unit 202 and the plurality of components 204. The separation wall 214 may prevent air from recirculating back into the configurable fan unit 202 after the air has passed through the configurable fan unit 202.

One or more power supply units 216 (e.g., two power supply units) may be supported by the bottom 112 of the housing 100. The power supply units 216 may be releasably attached to the back 104 of the housing 100 using, for example, captive screws 218 attached to part of each power supply unit 216, and corresponding holes (e.g., tapped holes) in the back 104 of the housing 100. In other embodiments, the power supply units 216 may be attached to the housing 100 using, for example, nut/bolt combinations, flanges, tabs, other devices, or a combination thereof. The plurality of holes 114 in the back 104 of the housing 100 may be included in the power supply units 216 or may be separate from the power supply units 216. The switch 200 may include different, additional, or fewer components.

The configurable fan unit 202 is removably inserted into the switch 200 in a first orientation. The configurable fan unit 202 is removably attached to the back 104 or other portion of the housing 100 using, for example, a captive screw 220 attached to the configurable fan unit 202, and a corresponding hole (e.g., a tapped hole) in the back 104 of the housing 100. In other embodiments, the configurable fan unit 202 may be attached to the housing 100 using, for example, nut/bolt combinations, flanges, tabs, other devices, or a combination thereof. The configurable fan unit 202 may be attached to the housing 100 above or below the bottom 112 of the housing 100. In the first orientation, the configurable fan unit 202 may pull air through the plurality of holes 114 in the back 104 of the housing 100 and push the air through the plurality of slots in the front 102 of the housing 100, as shown by arrow A in FIG. 1. The configurable fan unit 202 may include an alignment marking 222, and the back 104 of the housing 100 may include a corresponding alignment marking 224. When the alignment markings 222 and 224 align, the configurable fan unit 202 may be in the first orientation.

The configurable fan unit 202 may be removed from the switch 200 and rotated, and may be removably inserted into the switch 200 in a second orientation. The configurable fan unit 202 may be rotated 180° between the first orientation and the second orientation, for example. Other angles of rotation may be used. The configurable fan unit 202 may be removably attached to the back 104 or other portion of the housing 100 in the second orientation using the captive screw 220 and another corresponding hole (e.g., a tapped hole) in the back 104 or other portion of the housing 100. In the second orientation, the configurable fan unit 202 may pull air through the plurality of slots in the front 102 of the housing 100 and push the air through the plurality of holes 114 in the back 104 of the housing 100 (e.g., as shown by arrow B in FIG. 1). Alternatively, the configurable fan unit 202 may be oriented in the switch 200 for airflow between the top 110 and the bottom 112 of the housing 100 and/or airflow between the first side 106 and the second side 108 of the housing 100. The configurable fan unit 202 and/or the back 104 of the housing 100 may include additional alignment markings or no alignment markings at all.

Figure 3:
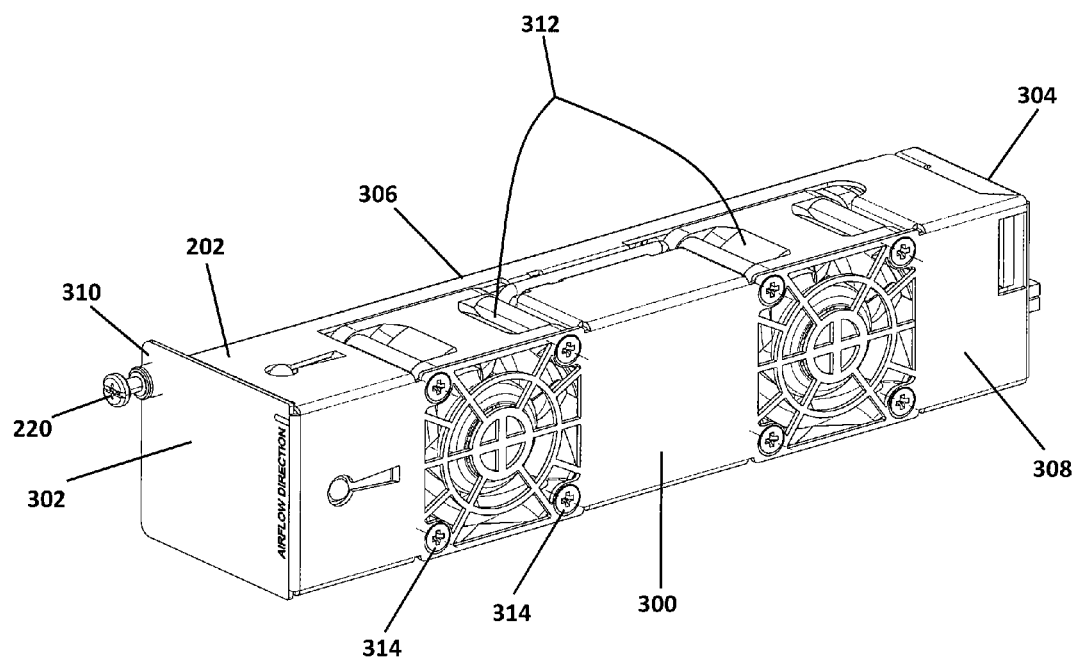
FIG. 3 illustrates a perspective view of one embodiment of a configurable fan unit.
Figure 4:
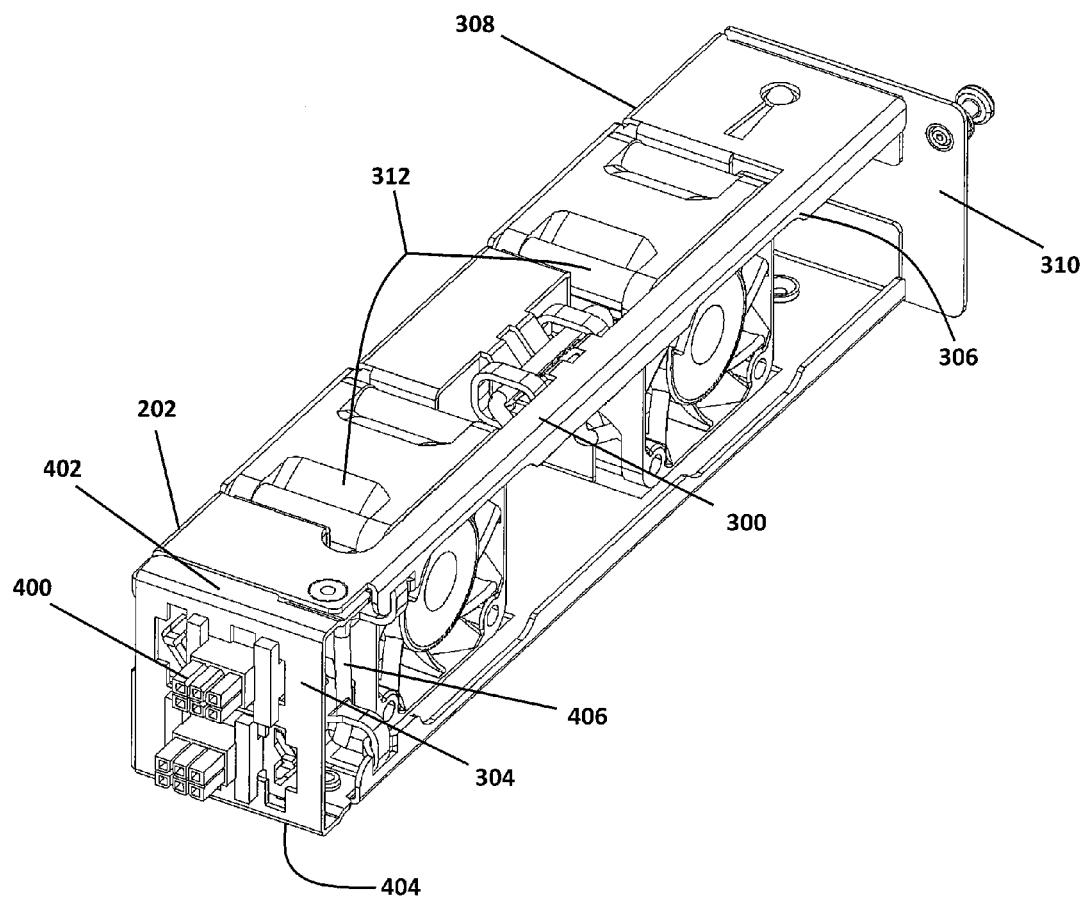
FIG. 4 illustrates another perspective view of the configurable fan unit of FIG. 3.

FIGS. 3 and 4 respectively illustrate a front perspective view and a back perspective view of one embodiment of the configurable fan unit 202 of FIG. 2 or a different configurable fan unit. The configurable fan unit 202 includes a fan housing 300 having a front 302, a back 304, a first side 306 and a second side 308. The fan housing 300 may be any number of shapes including, for example, rectangular. Alternatively, the fan housing 300 may be cylindrical with a circular, triangular, hexangular or other circumference. The front 302 of the fan housing 300 may include a portion that extends past the first side 306 of the fan housing 300 to form a flange 310. In one embodiment, the captive screw 220 may be attached to the flange 310 of the front 302 of the fan housing 300.

A plurality of fans 312 (e.g., two fans) may be supported by the fan housing 300. The plurality of fans 312 may be positioned in the fan housing 300, such that the axes of rotation of the plurality of fans 312 are offset and parallel. In one embodiment, the axes of rotation of the plurality of fans 312 are in-line. Each fan 312 of the plurality may be attached to the fan housing 300 using, for example, a plurality of screws 314 (e.g., four screws) and corresponding tapped holes in the fan 312. Tabs, flanges and/or other devices may be used instead of or in addition to the plurality of screws 314 to attach the plurality of fans 312 to the fan housing 300.

The plurality of fans 312 may be variable speed axial fans, for example. Other types of air movers including, for example, cross flow fans, centrifugal fans, backward curve impeller blowers, squirrel cage blowers or stacked axial fans may be used in addition to or instead of the axial fans 312. Each fan 312 of the plurality may include a DC brushless motor to rotate the plurality of fans 312. Low voltage such as, for example, 12 V may be used to power the motors of the plurality of fans 312. In one embodiment, each fan 312 of the plurality has a diameter of 120 mm. In other embodiments, different sized fans (e.g., 90 mm diameter fans) may be used. The fan housing 300 may include more or fewer fans 312 (e.g., four fans).

As shown in FIG. 4, the configurable fan unit 202 includes one or more electrical connectors 400 (e.g., two electrical connectors). The electrical connectors 400 may extend away from the back 304 of the fan housing 300, in a direction perpendicular to the back 304 of the fan housing 300. Alternatively, the electrical connectors 400 may extend from a top 402, a bottom 404, the first side 306 and/or the second side 308 of the fan housing 300 instead of or in addition to the back 304 of the fan housing 300. The electrical connectors 400 may be offset, such that one of the two electrical connectors 400 is closer to the first side 306 of the fan housing 300 and/or closer to the top 402 of the fan housing 300. The electrical connectors 400 may be 6-pin electrical connectors, for example. Alternatively, 3-pin or 4-pin connectors may be used. Male connectors are shown extending from the fan housing 300. In other embodiments, some or all of the electrical connectors 400 are female electrical connectors extending into the fan housing 300.

When the configurable fan unit 202 is in the first orientation relative to the housing 100, a first of the two electrical connectors 400 is mated with and electrically connected to a first switch-side connector to pull air through the plurality of holes 114 in the back 104 of the housing 100 (e.g., arrow A in FIG. 1). The configurable fan unit 202 may be removed from the switch 200, rotated 180°, and may be removably re-inserted in the second orientation relative to the housing 100. In the second orientation relative to the housing 100, a second of the two electrical connectors 400 is mated with and electrically connected to a second switch-side connector to push air through the plurality of holes 114 in the back 104 of the housing 100 (e.g., arrow B in FIG. 1). In other words, only one electrical connector 400 may be electrically connected to the switch 200 in each of the first and second orientations. The electrical connectors 400 and the switch-side connectors may be mated plugs, for example. Other arrangements may be used, such as just one connector with pin configurations used to distinguish orientations. Since the fans 312 may direct air in the same direction relative to the fan housing 300, one connector that connects in both orientations may be used. One connector may be provided on the fan housing 300, or the housing 100 for connection with different connectors on the other of the housing 100 or the fan housing 300.

When re-orienting the configurable fan unit 202, (e.g., between the first orientation and the second orientation), one of the electrical connectors 400 may move closer to the first side 106 and the top 110 of the housing 100, and the other of the electrical connectors 400 may move closer to the second side 108 and the bottom 112 of the housing 100, since the electrical connectors 400 are offset from each other. In one embodiment, the flange 310 of the fan housing 300 may act to shift the electrical connectors 400 in a direction towards the first side 106 or the second side 108 of the housing 100. The positional change of the electrical connectors 400 relative to the housing 100 when the configurable fan unit 202 is re-oriented from the first orientation to the second orientation allows a single electrical connector 400 to be attached and electrically connected to a single switch-side connector in each orientation.

Control of the configurable fan unit 202 (e.g., fan speed control and/or fan direction control) may depend on the electrical connector 400 that is connected. The switch-side connectors may be electrically connected (e.g., soldered) to the PCB 206 or another substrate (hereinafter, the PCB 206). The PCB 206 may include one or more fan controllers electrically connected to a memory and the switch-side connectors via traces on the PCB 206. The fan controller may include one or more application specific integrated circuits, general processors, digital signal processors, combinations thereof, or other now known or later developed processor. The memory may include one or more of a read only memory (ROM), dynamic random access memory (DRAM), an optical or magnetic storage device, or any other type of memory or data storage device.

The fan controller may generate and transmit control signals (e.g., pulse width modulation signals and rotational direction control signals) to the plurality of fans 312 (e.g., via the PCB 206, the switch-side connectors and the electrical connectors 400) based on data stored in the memory (e.g., fan speed tables) and sensor signals received from the plurality of fans 312, for example. The switch-side connectors may be electrically connected to outputs of the one or more power supply units 216 via traces on the PCB 206 to provide power to the plurality of fans 312. The pulse width modulation signals may control the voltage applied to the plurality of fans 312 (e.g., the motors of the plurality of fans 312), thus controlling the rotational speed of each fan 312 of the plurality.

A plurality of wires 406 may electrically connect each fan 312 of the plurality to a corresponding electrical connector 400 (e.g., pins of the corresponding electrical connector 400). The plurality of wires 406 may include wires that transmit power (e.g., 12 V) to each fan 312 of the plurality, wires that transmit control signals (e.g., pulse width modulation and rotational direction control) to each fan 312 of the plurality, wires that transmit sensor signals (e.g., RPM of the plurality of fans 312 and/or a locked motor alarm signal when the fan is stopped) from each fan 312 of the plurality, and wires that are grounded. The sensor signals may be transmitted to the fan controller via the first or second switch-side connector. The sensor signals may be used by the fan controller to generate the control signals. Other wires may electrically connect the two electrical connectors 400, such that the plurality of fans 312 are operable to be powered, controlled and sensed when a single electrical connector 400 is electrically connected to a corresponding switch-side connector.

By using the configurable fan unit 202, one type of switch 200, for example, may be installed in a data center, regardless of the position (e.g., hot aisle or cold aisle) of the switch 200 in the data center. If the airflow direction needs to be changed (e.g., back-to-front airflow to front-to-back airflow), the configurable fan unit 202 may be removed from the switch 200 and rotated, and may be removably re-inserted into the switch 200 in a second orientation. With the fixed airflow direction switches of the prior art, spares may be maintained for both versions of the switch (e.g., back-to-front and front-to-back versions) in case of a failure within the data center. Also, each version may only be installed within certain locations in the data center (e.g., hot aisle or cold aisle). The configurable fan unit 202 of the present embodiments increases the flexibility of the positioning of the switch 200 within the data center, as the configurable fan unit 202 may be reoriented within the switch 200 after installation to change the airflow direction. Also, spares of only a single switch version may be maintained, thus reducing the number of spare switches that may be purchased for the data center.

The configurable fan unit 202 of the present embodiments may be used in any number of other systems including, for example, computers, servers, and stereo equipment (e.g., receivers and amplifiers). The configurable fan unit 202 may be used in any system that includes heat-generating components that are convectively cooled. The configurable fan unit 202 may also be used in any system that is included in a vertically stacked arrangement (e.g., racks in a data center).

Figure 5:
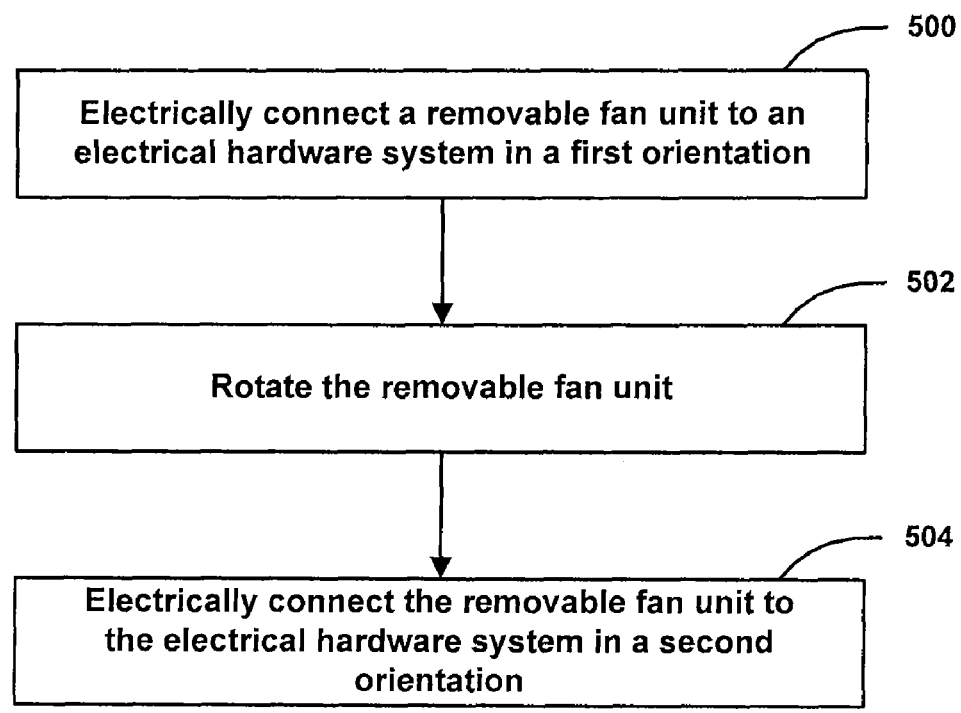
FIG. 5 illustrates a flow chart of using a configurable fan unit, according to one embodiment.

FIG. 5 illustrates a flow chart of one embodiment of using the configurable fan unit 202 shown in FIGS. 3 and 4 or a different configurable fan unit. The method is implemented in the order shown, but other orders may be used. Additional, different, or fewer acts may be provided.

At block 500, a removable fan unit is electrically connected to an electrical hardware system in a first orientation. The removable fan unit may include a fan supported in a fan housing. The removable fan unit may also include a first electrical connector extending from a back of the fan housing. The fan supported in the fan housing may be electrically connected to the first electrical connector with a plurality of wires. In one embodiment, the removable fan unit may include a plurality of fans (e.g., two fans) and a plurality of electrical connectors (e.g., two electrical connectors, the first electrical connector and a second electrical connector), the plurality of electrical connectors extending away from the back of the housing. Each fan of the plurality may be electrically connected to one of the two electrical connectors with a plurality of wires. Another plurality of wires may electrically connect the two electrical connectors, such that each fan of the plurality receives power and control signals when only one of the two electrical connectors is electrically connected to the electrical hardware system. The electrical connectors may be 6-pin connectors, for example. In other embodiments, 3-pin or 4-pin connectors may be used.

The removable fan unit may be inserted into a corresponding hole in a side, a top or a bottom of the electrical hardware system. The removable fan unit may be slid along an internal surface of the electrical hardware system, such that the first electrical connector (or one of the two electrical connectors) is mated with and electrically connected to a first electrical hardware system-side connector. A front of the fan housing may include a flange that extends past a side of the fan housing. In one embodiment, the removable fan unit may be removably attached to the electrical hardware system at the flange of the fan housing a captive screw attached to the flange, and a corresponding hole (e.g., tapped hole) in the housing of the electrical hardware system. Other fastening devices including, for example, nut/bolt combinations or other devices may be used instead of or in addition to the captive screw. The electrical hardware system may be a switch, for example.

The electrical hardware system-side connectors may be electrically connected to one or more outputs of power supplies of the electrical hardware system via traces on a printed circuit board (PCB) of the electrical hardware system, for example. The power supplies of the electrical hardware system may provide power (e.g., 12V) to the fans of the removable fan unit. The electrical hardware system-side connectors may also be electrically connected to one or more outputs of a fan controller via traces on the PCB of the electrical hardware system. The fan controller may generate and transmit control signals (e.g., rotational speed control signals (pulse width modulation) and rotational direction control signals) to each of the electrical hardware system-side connectors. The fan controller may include one or more application specific integrated circuits, general processors, digital signal processors, combinations thereof, or other now known or later developed processor.

In the first orientation of the removable fan unit relative to the electrical hardware system (e.g., with the one of the two electrical connectors attached and electrically connected to the first electrical hardware system-side connector), the fans of the removable fan unit may move air through the electrical hardware system in a first direction (e.g., back-to-front airflow).

At block 502, the removable fan unit is rotated. The removable fan unit may be detached from the electrical hardware system using the captive screw and may be removed from the electrical hardware system. Alternatively, the removable fan unit may be rotated without being removed from the electrical hardware system. The removable fan unit may be rotated 180°, for example. In other embodiments, the removable fan unit may be rotated more or less than 180°.

At block 504, the removable fan unit is electrically connected to the electrical hardware system in a second orientation. The removable fan unit may be inserted into the electrical hardware system, such that the electrical connector (or the other of the two electrical connectors) is mated with and electrically connected to the second electrical hardware system-side connector. The electrical connectors may be offset relative to one or more sides of the fan housing. When the removable fan unit is moved between the first and second orientations, the flange of the fan housing may act to shift the electrical connectors closer to a side of the electrical hardware system. The positional change of the electrical connectors relative to the electrical hardware system when the removable fan unit is re-oriented from the first orientation to the second orientation allows one electrical connector to be electrically connected to one electrical hardware system-side connector in each orientation of the removable fan unit. The removable fan unit may be removably attached to the electrical hardware system at the flange of the fan housing the captive screw attached to the flange, and another corresponding hole (e.g., tapped hole) in the housing of the electrical hardware system. In the second orientation of the removable fan unit relative to the electrical hardware system, the fans of the removable fan unit may move air through the electrical hardware system in a second direction (e.g., front-to-back airflow).

The fan controller may control the rotational direction of the fans and the speed at which the fans rotate based on the orientation of the removable fan unit relative to the electrical hardware system. In the first orientation of the removable fan unit relative to the electrical hardware system, the fan controller may control the fans to pull air through openings in the back of the electrical hardware system and push air through openings in the front of the electrical hardware system (e.g., back-to-front airflow). In the second orientation of the removable fan unit relative to the electrical hardware system, the fan controller may control the fans to pull air through the openings in the front of the electrical hardware system and push air through the openings in the back of the electrical hardware system (e.g., front-to-back airflow). The fans of the removable fan unit may be rotated at different speeds depending on the electrical hardware system-side connector electrically connected to the removable fan unit (e.g., the fans may be rotated at a greater rotational velocity if back-to-front airflow).

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. An apparatus comprising:
a fan unit housing comprising a back, the fan unit housing being removably attachable to a computer system;
a fan supported by the fan unit housing; and
an electrical connector on the back of the fan unit housing, the electrical connector being electrically connected to the fan,
wherein the fan unit housing is operable to be positioned in the computer system in two different orientations, such that the electrical connector is physically mated with a first computer system-side connector in at least one of the two different orientations, and
wherein the fan is operable to be electrically connected to the computer system in each of the two different orientations, such that the fan moves air through the computer system in two corresponding directions.

2. The apparatus of claim 1, wherein the fan is a first fan, and
wherein the apparatus further comprises a second fan attached to the fan housing.

3. The apparatus of claim 2, wherein the first fan and the second fan are attached to the fan unit housing, such that the axis of rotation of the first fan is parallel to and offset from the axis of rotation of the second fan.

4. The apparatus of claim 2, wherein the electrical connector is a first electrical connector, and
wherein the apparatus further comprises a second electrical connector on the fan unit housing.

5. The apparatus of claim 4, wherein each of the first and second fans is electrically connected to one of the first and second electrical connectors, and
wherein the first electrical connector is electrically connected to the second electrical connector.

6. The apparatus of claim 5, wherein the fan unit housing is operable to be removably inserted into the computer system, such that the first electrical connector is physically mated with and electrically connected to the first computer system-side connector, and
wherein the first and second fans move air through the fan unit housing in a first direction.

7. The apparatus of claim 6, wherein the fan unit housing is operable to be rotated 180° and removably inserted into the computer system, such that the second electrical connector is physically mated with and electrically connected to a second computer system-side connector, and
wherein the first and second fans move air through the fan unit housing in a second direction.

8. The apparatus of claim 7, wherein the fan unit housing further comprises a front and a first side, and
wherein the front of the fan unit housing includes a portion that extends from the first side of the fan unit housing, in a direction away from the first side of the fan unit housing.

9. An apparatus comprising:
a rack-mounted electrical hardware component comprising a heat generating component; and
a fan unit removably attached to the rack-mounted electrical hardware component in a first orientation, the fan unit comprising:
a fan housing comprising a back;
two fans attached to the fan housing; and
two electrical connectors extending from the back of the fan housing, the two electrical connectors being electrically connected to the two fans,
wherein the fan unit is operable to be removably inserted into the rack-mounted electrical hardware component, such that one of the two electrical connectors is physically mated with and electrically connected to a corresponding rack-mounted electrical hardware component-side connector, and
wherein, in the first orientation, the two fans move air through the apparatus in a first direction relative to the rack-mounted electrical hardware component to cool the heat generating component.

10. The apparatus of claim 9, wherein the fan unit is operable to be rotated 180° and removably inserted into the rack-mounted electrical hardware component in a second orientation, such that the other of the two electrical connectors is physically mated with and electrically connected to another corresponding rack-mounted electrical hardware component-side connector, and
wherein, in the second orientation, the two fans move air through the apparatus in a second direction relative to the rack-mounted electrical hardware component to cool the heat generating component.

11. The apparatus of claim 9, wherein the fan housing comprises a front and a first side, the front of the fan housing including a portion that extends from the first side of the fan housing, in a direction away from the first side of the fan housing, and
wherein the fan unit is attachable to the rack-mounted electrical hardware component at the portion that extends from the first side of the fan housing.

12. The apparatus of claim 9, wherein the rack-mounted electrical hardware component is a switch.

13. The apparatus of claim 9, wherein the rack-mounted electrical hardware component further comprises a baffle to guide airflow in the apparatus.

14. The apparatus of claim 9, wherein the two fans are attached to the fan housing, such that the axes of rotation of the two fans are parallel and offset.

15. A method comprising:
electrically connecting a removable fan unit to an electrical hardware system, the connection configured to move air through the electrical hardware system in a first direction;
rotating the removable fan unit; and
electrically connecting the removable fan unit to the electrical hardware system to move air through the electrical hardware system in a second direction,
wherein electrically connecting the removable fan unit comprises physically mating an electrical connector on the removable fan unit with an electrical hardware system-side connector.

16. The method of claim 15, wherein electrically connecting the removable fan unit further comprises inserting the removable fan unit into a corresponding opening in an external surface of the electrical hardware system.

17. The method of claim 16, further comprising removing the removable fan unit from the electrical hardware system.

18. The method of claim 15, further comprising guiding air adjacent to a heat generating component disposed in the electrical hardware system.

19. The method of claim 15, wherein the removable fan unit is rotated 180°.

20. The method of claim 15, further comprising attaching the removable fan unit to the electrical hardware system with a captive screw.

* * * * *